United States Patent [19]

Bernewitz et al.

[11] Patent Number: 4,657,627
[45] Date of Patent: Apr. 14, 1987

[54] CARBON FIBER SUBSTRATE PRETREATMENT FOR MANUFACTURING CRACK-FREE, LARGE-SURFACE SILICON CRYSTAL BODIES FOR SOLAR CELLS

[75] Inventors: Lore Bernewitz, Munich; Richard Falckenberg, Wald; Gerhard Hoyler, Munich; Josef Grabmaier, Starnberg, all of Fed. Rep. of Germany

[73] Assignee: Siemens Aktiengesellschaft, Berlin and Munich, Fed. Rep. of Germany

[21] Appl. No.: 714,842

[22] Filed: Mar. 22, 1985

[30] Foreign Application Priority Data

Apr. 9, 1984 [DE] Fed. Rep. of Germany ....... 3413355

[51] Int. Cl.[4] .................. B05D 5/12; H01L 31/18; C30B 29/00; C30B 19/12
[52] U.S. Cl. .................. 156/607; 156/621; 156/DIG. 64; 156/DIG. 84; 156/DIG. 88; 427/74; 427/86
[58] Field of Search .............. 156/607, 622, DIG. 88, 156/DIG. 64, DIG. 89, 624; 427/39, 74, 86

[56] References Cited

U.S. PATENT DOCUMENTS

| | | | |
|---|---|---|---|
| 4,169,739 | 10/1979 | Lindmayer | 156/DIG. 88 |
| 4,305,776 | 12/1981 | Grabmaier | 156/607 |
| 4,478,880 | 10/1984 | Belouet | 156/DIG. 88 |
| 4,487,880 | 12/1984 | Ueno et al. | 427/39 |
| 4,533,428 | 8/1985 | Grabmaier | 156/DIG. 88 |
| 4,554,203 | 11/1985 | Grabmaier et al. | 156/607 |

FOREIGN PATENT DOCUMENTS 3010557 9/1981 Fed. Rep. of Germany .

OTHER PUBLICATIONS

Schuldt et al, Conf. 15th IEEE Photovoltaic Specialists 1981.

Primary Examiner—Gary P. Straub

[57] ABSTRACT

A method for manufacturing crack-free, large-surface silicon crystal bodies for solar cells wherein a carrier member composed of a carbon fiber fabric is coated with silicon by bringing a molten silicon into contact with the carrier member and crystallizing it. In order to improve the wettability, the carrier member is subjected to an activating surface treatment before the coating. The method is useful for continuous manufacture of silicon sheets for solar cells.

6 Claims, 8 Drawing Figures

CARBON FIBER SUBSTRATE PRETREATMENT FOR MANUFACTURING CRACK-FREE, LARGE-SURFACE SILICON CRYSTAL BODIES FOR SOLAR CELLS

BACKGROUND OF THE INVENTION

The invention relates to a method for manufacturing crack-free, quasi-monocrystalline, large-surface silicon crystal bodies for solar cells by continuous coating of a planar carrier member having a net-like structure and composed of a carbon fiber fabric. The molten silicon is brought into contact with the carrier member and the carrier member is integrated into the silicon body upon crystallization of the silicon.

Such a method is disclosed, for example, in German OS. No. 30 10 557 A1, incorporated herein by reference. A method for manufacturing silicon sheets giving high through put ($\simeq 1$ m$^2$/min) for solar cells is disclosed therein whereby the coating is controlled with respect to the drawing rate such that a thin silicon layer is formed in the meshes of the net due to the high surface tension of the molten silicon. Accordingly, the network formed of the fibers is integrated in the silicon body after the body has solidified. During coating, the carrier member is drawn through a gap-shaped opening in the bottom of a melt crucible. The carrier member, however, can also be drawn tangentially across the surface of the silicon melt situated in a tub, such as is known, for example, from German OS No. 28 50 805.6 corresponding to U.S. Pat. No. 4,305,776 and incorporated herein by reference.

SUMMARY OF THE INVENTION

An object underlying the invention is to improve the known methods with respect to the wettability of the carrier member with molten silicon.

The wettability of the carbon fiber fabric employed as the carrier member with molten silicon depends on the pretreatment of the fabric and has a great influence on the properties of the planar silicon which results. Given poorly wetting carbon fiber fabric, planar silicon wtih micro-cracks occurs, this being unusable for the manufacture of solar cells. The creation of these micro-cracks is attributed to the difference in the coefficient of thermal expansion between silicon and carbon fibers. For silicon, thus the coefficient of thermal expansion $\alpha \times 10^6/°K.$ is $+2.3$ at $T \simeq 300°$ K., and is $-0.6$ for carbon fibers parallel to the fiber direction, $+5$ for carbon fibers perpendicular to the fiber direction, and $+3.1$ for silicon carbide.

The difference in coefficients of thermal expansion comes fully to bear given poor wetting. With good wetting, the filaments lying at the outside and close to the surface of the carrier member react completely to produce silicon carbide and the filaments lying further towards the inside of the carrier member largely react to produce silicon carbide. Since the coefficient of silicon carbide, as shown above, comes very close to that of silicon, the stresses arising during cooling are slight and can no longer cause cracks in the surface.

The invention exploits this perception and achieves the above object of improving the wetting since the carrier member formed of the carbon fiber fabric is subjected before the silicon coating to an activating surface treatment in such manner that non-saturated bonds arise at the surface. This surface treatment occurs at least in those regions provided for the coating. It is thus within the framework of the invention to perform the method either by means of a temperature treatment in the region of 2500° C. in a flowing halogen gas atmosphere or inert gas atmosphere and/or is undertaken by means of heating the carbon fiber fabric in a hydrogen-/oxygen flame at air and/or by means of exposing the carbon fiber fabric to a corona discharge in the air.

With the invention, there is the possibility of partially treating the carrier member, i.e. of restricting oneself to such surfaces on which a coating is desired and leaving regions that are not be coated untreated. Such regions are the edges of the net as well as the strips which are required for the separation of the coated fabric into the individual silicon plates intended for further processing into solar cells.

Since the surface activation of a carbon fiber fabric is not preserved over longer time spans due to the saturation of the free bonds, it is provided according to the invention to repeat the activating process.

DESCRIPTION OF THE PREFERRED EMB0DIMENTS

Figure 1:
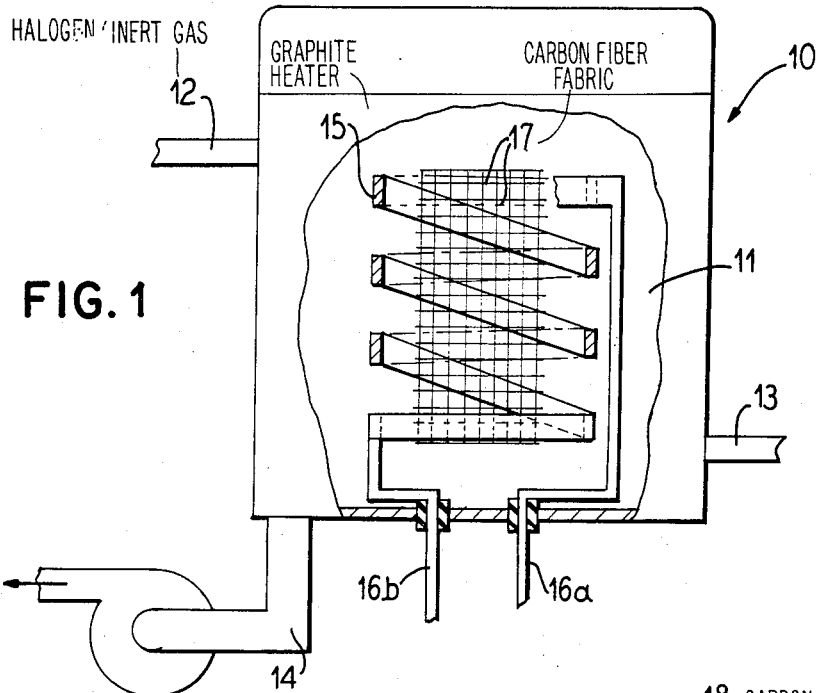
FIG. 1 is a front view of a temperature treatment system for treating a net-like carrier member in a flowing gas at high temperature prior to application of molten silicon.

In a first embodiment of the invention as shown in FIG. 1, a temperature reaction system 10 is provided comprising a vacuum container 11 having a halogen/inert gas inlet 12 and a gas outlet 13. A vacuum outlet 14 connects to a vacuum pump.

Within container 11 a graphite heater 15 is provided having connection leads 16a, 16b. The net-like carbon fiber fabric 17 is supported centrally of the heater 15.

The carbon fiber fabric is subjected to a temperature of about 2500° C. in a flowing halogen as atmosphere or inert gas atmosphere. Preferably gases selected from the class of frigens or freons, HCl, and Ar may be employed. A typical processing time is less than 24 hours.

Figure 2A:
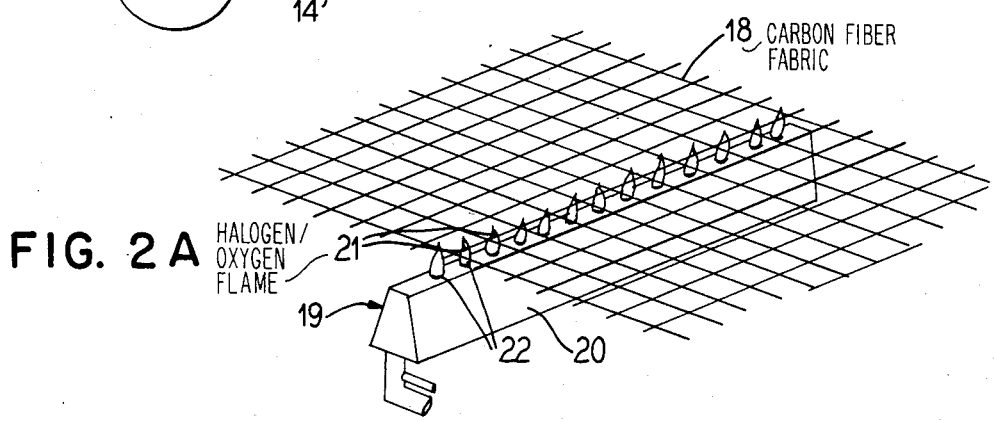
FIGS. 2a and 2b are perspective and side views, respectively of a flame treatment of the planar carrier member.
Figure 2B:
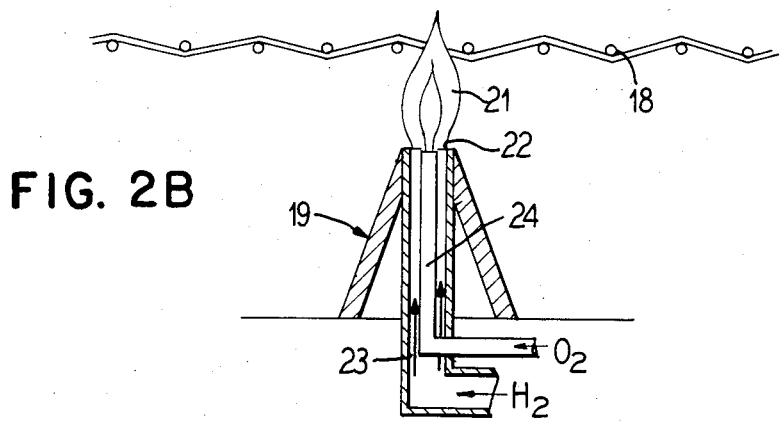

As shown in FIGS. 2a and 2b, the carbon fiber fabric 18 may be heated in a hydrogen/oxygen flame in an air environment. A flame producing unit 19 is provided comprising a base unit 20 with a plurality of nozzles 22 from which individual hydrogen/oxygen flames 21 are directed upwardly through the net-like fabric 18. O$_2$ is directed upwardly through a central channel 24 at each nozzle 22 and H$_2$ is directed upwardly through an outer coaxial channel 23. The hydrogen/oxygen mixture is in a molar-ratio of $\leq 2:1$, and a processing velocity of $\leq 6$ cm/min is preferably employed depending on flame size and strength.

Figure 3A:
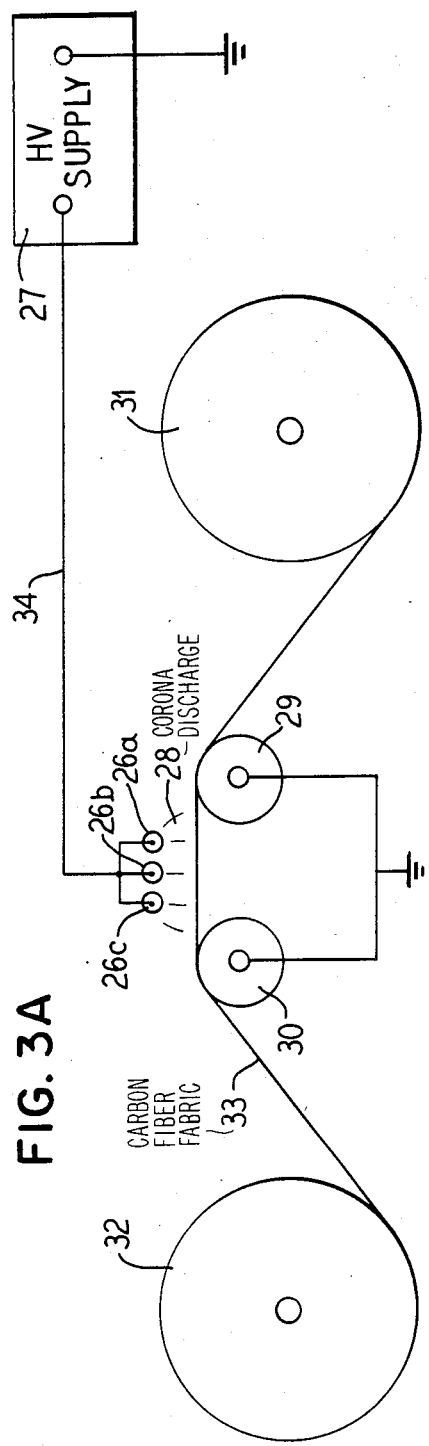
FIGS. 3a and 3b are side and top views respectively of a corona discharge system for treating the planar carrier member.
Figure 3B:
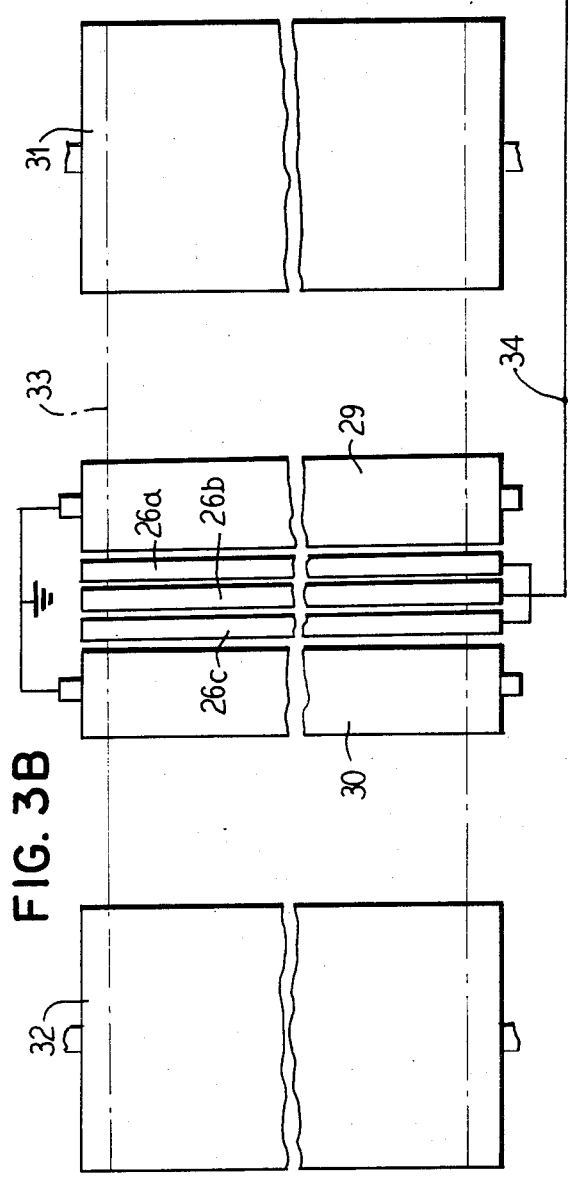

As shown in FIGS. 3a and 3b, the carbon fiber fabric may be treated through a corona discharge in air. A high voltage supply 27 having a voltage of approximately 10 Kv and a frequency from 16–40 KHz connects to for example three electrodes 26a, 26b, 26c so as to create a corona discharge 28 which envelops net-like carbon fiber fabric 33 between rollers 29 and 30 which are grounded. A feed roller 31 and a take-up roller 32 are also provided. Line 34 connects the high voltage supply to the electrodes 26a, 26b, 26c.

Figure 4A:
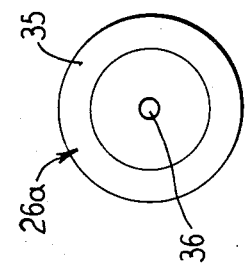
FIGS. 4a and 4b are fragmentary longitudinal cross-sectional views of an electrode used in the corona discharge system of FIGS. 3a and 3b.
Figure 4B:
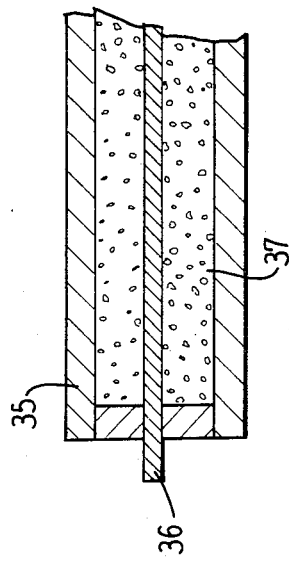

As shown in FIGS. 4a and 4b, a typical electrode 26a is formed of a quartz tube 35 with an inner metallic core 36 surrounded by aluminum granules 37 between the core 36 and quartz tube 35. A typical outer diameter of the quartz tube is 12 mm and a typical inner diameter is 8 mm.

Processing velocity is dependent on the number of electrodes and on an intensity of the corona discharge. For example with three electrodes a velocity of $\leq 6$ cm/min is typical.

Figure 5:
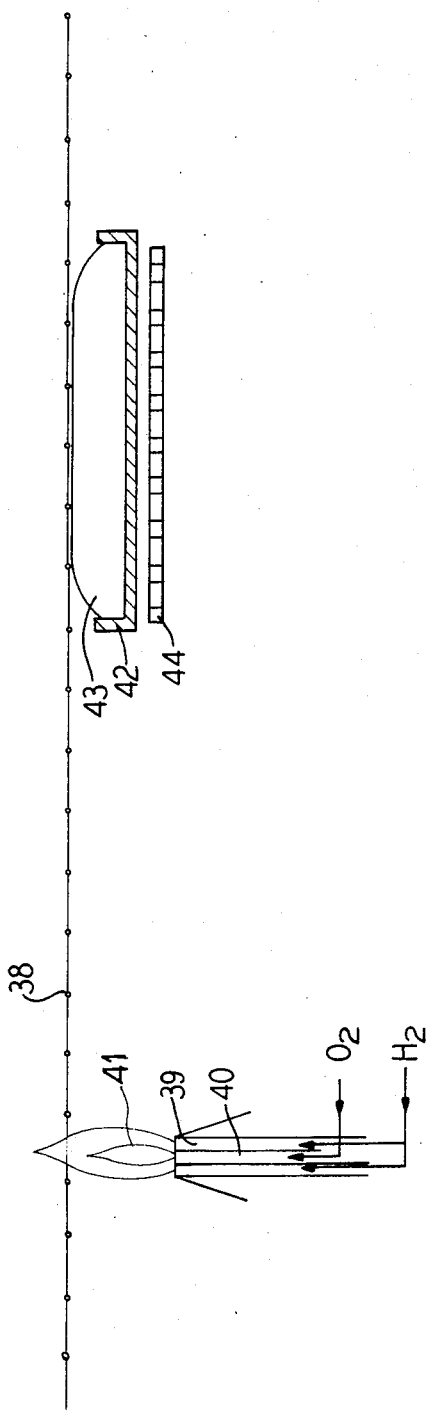
FIG. 5 is a side view of an integrated process wherein the planar carrier member is first treated in accordance with the invention and then coated with molten silicon.

As shown in FIG. 5, the silicon coating process can be integrated with the activating surface treatment process according to the invention. A moving net 38 of carbon fiber fabric which moves to the right is first subjected to a flame treatment by flame 41 fed by an $O_2/H_2$ gas mixture as previously explained by use of gas feed tubes 40 and 39. Thereafter, the net is exposed to a silicon melt 43 in a container 42 heated by a heater 44.

Although various minor changes and modifications might be proposed by those skilled in art, it will be understood that we wish to include within the claims of the patent warranted hereon all such changes and modifications as reasonably come within our contribution to the art.

We claim as our invention:

1. In a method for manufacturing crack-free, quasi-monocrystalline, large-surface silicon crystal bodies for solar cells by continuous coating of a planar carrier member having a net-like structure and comprised of a carbon fiber fabric, and wherein a molten silicon is brought into contact with said carrier member such that said carrier member becomes integrated in a silicon body when said silicon crystallizes, wherein the improvement comprises the steps of:
    improving wettability of the carrier member comprising carbon fiber fabric by subjecting the carrier member, prior to coating with molten silicon, to an activating surface treatment in such fashion that non-saturated C-bonds arise at a surface of the carrier member, said activating surface treatment being carried out at least in those regions on which the silicon coating will be provided, and the activating surface treatment comprising subjecting the carrier member to a temperature treatment of about 2500° C. in a flowing halogen gas atmosphere.

2. A method according to claim 1 including the step of integrating the activation process in the coating process by continuously moving the carrier member from a temperature treatment station to a station where it is exposed to a silicon melt.

3. In a method for manufacturing crack-free, quasi-monocrystalline, large-surface silicon crystal bodies for solar cells by continuous coating of a planar carrier member having a net-like structure and comprised of a carbon fiber fabric, and wherein a molten silicon is brought into contact with said carrier member such that said carrier member becomes integrated in a silicon body when said silicon crystallizes, wherein the improvement comprises the steps of:
    improving wettability of the carrier member comprising carbon fiber fabric by subjecting the carrier member, prior to coating with molten silicon, to an activating surface treatment in such fashion that non-saturated C-bonds arise at a surface of the carrier member, said activating surface treatment being carried out at least in those regions on which the silicon coating will be provided; and
    said activating surface treatment comprising the step of heating said carbon fiber fabric in a hydrogen/oxygen flame in air.

4. In a method for manufacturing crack-free, quasi-monocrystalline, large-surface silicon crystal bodies for solar cells by continuous coating of a planar carrier member having a net-like structure and comprised of a carbon fiber fabric, and wherein a molten silicon is brought into contact with said carrier member such that said carrier member becomes integrated in a silicon body when said silicon crystallizes, wherein the improvement comprises the steps of:
    improving wettability of the carrier member comprising carbon fiber fabric by subjecting the carrier member, prior to coating with molten silicon, to an activating surface treatment in such fashion that non-saturated C-bonds arise at a surface of the carrier member, said activating surface treatment being carried out at least in those regions on which the silicon coating will be provided; and
    said activating surface treatment comprising the step of exposing said carbon fiber fabric to a corona discharge in air.

5. A method according to claim 1 including the step of repeating the activation process.

6. A method for manufacturing crack-free, quasi-monocrystalline large-surface silicon crystal bodies, comprising the steps of:
    providing a net-like carbon fiber fabric structure as a carrier member;
    improving wettability of said carrier member by subjecting the carrier member in a flowing halogen gas atmosphere to an activating surface temperature treatment at about 2500° C. such that non-saturated C-bonds arise at portions of the carrier member; and
    after improving its wettability, coating the carrier member with molten silicon.

* * * * *